(12) United States Patent
Yamano

(10) Patent No.: US 7,772,118 B2
(45) Date of Patent: Aug. 10, 2010

(54) SUBSTRATE HAVING HIGH ELECTRICAL CONNECTION RELIABILITY OF A PENETRATING VIA CONNECTED TO WIRINGS AND A METHOD FOR MANUFACTURING THE SAME

(75) Inventor: Takaharu Yamano, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 68 days.

(21) Appl. No.: 12/061,768

(22) Filed: Apr. 3, 2008

(65) Prior Publication Data

US 2008/0261396 A1    Oct. 23, 2008

Related U.S. Application Data

(62) Division of application No. 11/247,813, filed on Oct. 11, 2005, now abandoned.

(30) Foreign Application Priority Data

Nov. 8, 2004    (JP) .............................. 2004-323939

(51) Int. Cl.
*H01L 21/44* (2006.01)
*H01L 23/52* (2006.01)
*H01L 23/48* (2006.01)
*H01L 29/40* (2006.01)
*H01L 21/768* (2006.01)

(52) U.S. Cl. ........................ 438/667; 438/668; 257/774; 257/698; 257/621; 257/E21.597; 257/E23.011

(58) Field of Classification Search ................ 438/667, 438/668; 257/774, 698, 621, E21.597, E23.011
See application file for complete search history.

(56) References Cited

U.S. PATENT DOCUMENTS

| 5,071,359 | A | 12/1991 | Arnio et al. |
| 5,638,598 | A | 6/1997 | Nakaso et al. |
| 5,819,406 | A | 10/1998 | Yoshizawa et al. |
| 6,055,723 | A | 5/2000 | Akerling et al. |
| 6,768,205 | B2 * | 7/2004 | Taniguchi et al. ........... 257/774 |
| 6,818,837 | B2 | 11/2004 | Okami |
| 7,091,589 | B2 * | 8/2006 | Mori et al. .................. 257/686 |
| 2002/0038725 | A1 | 4/2002 | Suzuki et al. |
| 2002/0189856 | A1 | 12/2002 | Takenaka et al. |
| 2003/0066683 | A1 | 4/2003 | Suzuki et al. |

(Continued)

FOREIGN PATENT DOCUMENTS

JP    63-137498    6/1988

(Continued)

*Primary Examiner*—Luan C Thai
(74) *Attorney, Agent, or Firm*—Ladas & Parry LLP

(57) ABSTRACT

A disclosed substrate is composed of a base member having a through-hole, a penetrating via provided in the through-hole, and a wiring connected to the penetrating via. The penetrating via includes a penetrating part having two ends on both sides of the base member, which is provided in the through-hole, a first protrusion protruding from the base member, which is formed on a first end of the penetrating part so as to be connected to the wiring, and a second protrusion protruding from the base member, which is formed on a second end of the penetrating part. The first protrusion and second protrusion are wider than a diameter of the through-hole.

20 Claims, 19 Drawing Sheets

U.S. PATENT DOCUMENTS

| | | |
|---|---|---|
| 2003/0135994 A1 | 7/2003 | Shutou et al. |
| 2004/0154827 A1 | 8/2004 | Terrell et al. |
| 2005/0012217 A1 | 1/2005 | Mori et al. |
| 2006/0185141 A1 | 8/2006 | Mori et al. |

FOREIGN PATENT DOCUMENTS

| | | |
|---|---|---|
| JP | 1-258457 | 10/1989 |
| JP | 5-190610 | 7/1993 |
| JP | 2004-146742 | 5/2004 |
| JP | 2004-193292 | 7/2004 |
| JP | 2004-235528 | 8/2004 |
| WO | 2004/054340 A1 | 6/2004 |

* cited by examiner

US 7,772,118 B2

SUBSTRATE HAVING HIGH ELECTRICAL CONNECTION RELIABILITY OF A PENETRATING VIA CONNECTED TO WIRINGS AND A METHOD FOR MANUFACTURING THE SAME

CROSS-REFERENCE TO RELATED APPLICATIONS

The present application is based on Japanese Priority Application No. 2004-323939 filed on Nov. 8, 2004, with the Japanese Patent Office, the entire contents of which are hereby incorporated by reference. This application is a division of application Ser. No. 11/247,813, filed Oct. 11, 2005 now abandoned.

BACKGROUND OF THE INVENTION

1. Field of the Invention

The present invention generally relates to a substrate and a method for manufacturing the same and, more particularly, a substrate having a penetrating via penetrating a base member, wiring connected to the penetrating via, and a method for manufacturing the same.

2. Description of the Related Art

In these years, by using fine processing technology of a semiconductor, packages called MEMS (Micro Electro Mechanical Systems) for micro machines and substrates such as interposers mounting a semiconductor device therein, are developed. The above described substrate includes wirings formed on both sides of the substrate and penetrating vias penetrating the substrate and electrically connecting the wirings formed on both sides of the substrate.

FIG. 1 is a diagram showing a conventional substrate. As shown in FIG. 1, a substrate 10 is composed of a silicon member 11, an insulating layer 13, penetrating vias 15, wirings 17, solder resists 19 and 24, and wirings 21. In the silicon member 11, through-holes 12 are formed. The insulating layer 13 is formed on the surface of the silicon member 11 wherein a through-hole 12 is formed. The insulating layer 13 is provided for insulating the silicon member 11 from the penetrating via 15, the wiring 17, and the wiring 21. The penetrating via 15 which is cylindrical in shape is provided in the through-hole 12 where the insulating layer 13 is formed. Moreover, an edge part 15a of the penetrating via 15 and a surface 13a of the insulating layer 13 are to be even, and another edge part 15b of the penetrating via 15 and another surface 13b of the insulating layer 13 are to be even. The above described penetrating via 15 is formed by the steps of forming a seed layer by a spattering method on the silicon member 11 where the insulating layer 13 is formed, and separating out a conductive metal layer such as Cu on the seed layer by the electrolytic plating method and growing the metal layer (See Patent Document 1, for example).

The wiring 17 having an external connection terminal 18 is provided on the upper surface of the silicon member 11 so as to be connected to the edge part 15a of the penetrating via 15. MEMS and a semiconductor device 25 are mounted on the external connection terminal 18. Solder resist 19 exposing the external connection terminal 18 is provided on the upper surface of the silicon member 11 so as to cover the wiring 17 except the external connection terminal 18.

The wiring 21 having an external connection terminal 22 is provided on the undersurface of the silicon member 11 so as to be connected to the other edge part 15b of the penetrating via 15. The external connection terminal 22 is provided for being connected to another substrate such as a motherboard. Solder resist 24 exposing the external connection terminal 22 is provided on the undersurface of the silicon member 11 so as to cover the wiring 21 except the external connection terminal 22.

[Patent Document 1] Japanese Patent Application Laid-Open Disclosure No. 1-258457

The shape of the conventional penetrating via 15 is cylindrical. However, water infiltrates into a gap between the edge part 15a of the penetrating via 15 and the insulating layer 13, and a gap between the other edge part 15b and the insulating layer 13, and thereby, the penetrating via 15 becomes degraded and the electrical connection reliability of the penetrating via 15 connecting the wirings 17 and 21 is also degraded. Moreover, according to the conventional method for forming the penetrating via 15, the separated conductive metal layer on the surface of the seed layer is formed on the inside edges of the through-hole 12 and the conductive metal layer is grown along the inside edges of the through-hole 12, and thus, a void (cavity) forms near the center of the penetrating via 15. Therefore, the electrical connection reliability of the penetrating via 15 connected to the wirings 17 and 21 is degraded.

SUMMARY OF THE INVENTION

It is a general object of the present invention to provide a substrate improving the electrical connection reliability of a penetrating via connecting the wirings and a method for manufacturing the same that substantially obviate one or more problems caused by the limitations and disadvantages of the related art.

Features and advantages of the present invention are presented in the description which follows, and in part will become apparent from the description and the accompanying drawings, or may be learned by practice of the invention according to the teachings provided in the description. Objects as well as other features and advantages of the present invention will be realized and attained by the substrate particularly pointed out in the specification in such full, clear, concise, and exact terms as to enable a person having ordinary skill in the art to practice the invention.

According to at least one of the embodiments of the present invention, a substrate is provided which includes a base member having a through-hole, a penetrating via provided in the through-hole, and a first wiring and a second wiring connected to the penetrating via, wherein the penetrating via includes a penetrating part provided in the through-hole, the penetrating part having a first end and a second end, a first protrusion protruding from the base member, the first protrusion being connected to the first end of the penetrating part so as to be connected to the first wiring, and a second protrusion protruding from the base member, the second protrusion being connected to the second end of the penetrating part so as to be connected to the second wiring, wherein the first protrusion and second protrusion are wider than a diameter of the through-hole.

Accordingly, the first protrusion and the second protrusion being wider than the diameter of the through-hole are connected to the penetrating via so as to prevent water from infiltrating the gap between the penetrating part and the base member, and thereby, the penetrating via is prevented from being degraded; thus, the electric connection reliability of the penetrating via connected to the wiring can be improved.

According to another embodiment of the present invention, a substrate is provided which includes a base member having a through-hole, a penetrating via provided in the through-hole, and a first wiring and a second wiring connected to the penetrating via, wherein the penetrating via includes a penetrating part provided in the through-hole having a first end and a second end, and a protrusion to be connected to the first wiring, being connected to the first end of the penetrating part and another protrusion to be connected to the second wiring, being connected to the second end of the penetrating part, wherein the protrusion is wider than the diameter of the through-hole.

Accordingly, a protrusion being wider than the diameter of the through-hole is connected to each end of the penetrating part so as to prevent water from infiltrating the gap between the penetrating part and the base member, and thereby, the penetrating via is prevented from being degraded; thus the electric connection reliability of the penetrating via connected to the wiring can be improved.

According to another embodiment of the present invention, a method for manufacturing a substrate which is composed of a base member having a through-hole, a penetrating via formed in the through-hole in the base member, and wiring connected to an end of the penetrating via, wherein the penetrating via includes a penetrating part provided in the through-hole, having a first end and a second end, a first protrusion protruding from the base member, being connected to the first end of the penetrating part so as to be connected to the wiring, and a second protrusion protruding from the base member, being connected to the second end of the penetrating part, wherein the first protrusion and second protrusion are wider than the diameter of the through-hole is provided. The method for manufacturing the substrate further includes the steps of forming the penetrating via, and forming wiring so as to be connected to the first protrusion.

According to at least one embodiment of the present invention, the first protrusion and the second protrusion both wider than the diameter of the through-hole are connected to the penetrating via so as to prevent water from infiltrating the gap between the penetrating part and the base member, and thereby, the penetrating via is prevented from being degraded; thus, the electric connection reliability of the penetrating via connected to the wiring can be improved.

Therefore, a substrate wherein the electric connection reliability of the penetrating via connected to the wiring is improved, and a method for manufacturing the same can be provided.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

In the following, embodiments of the present invention are described with reference to the accompanying drawings.

First Embodiment

Figure 1:
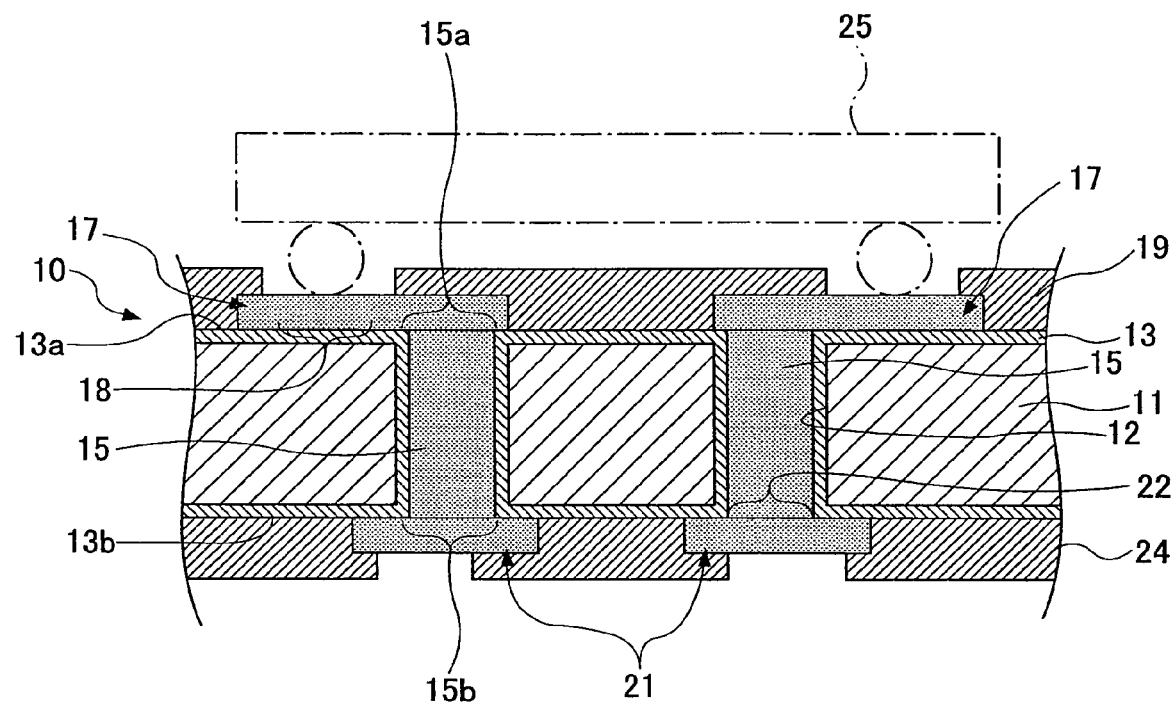
FIG. 1 is a diagram showing a substrate of the prior art.
Figure 2:
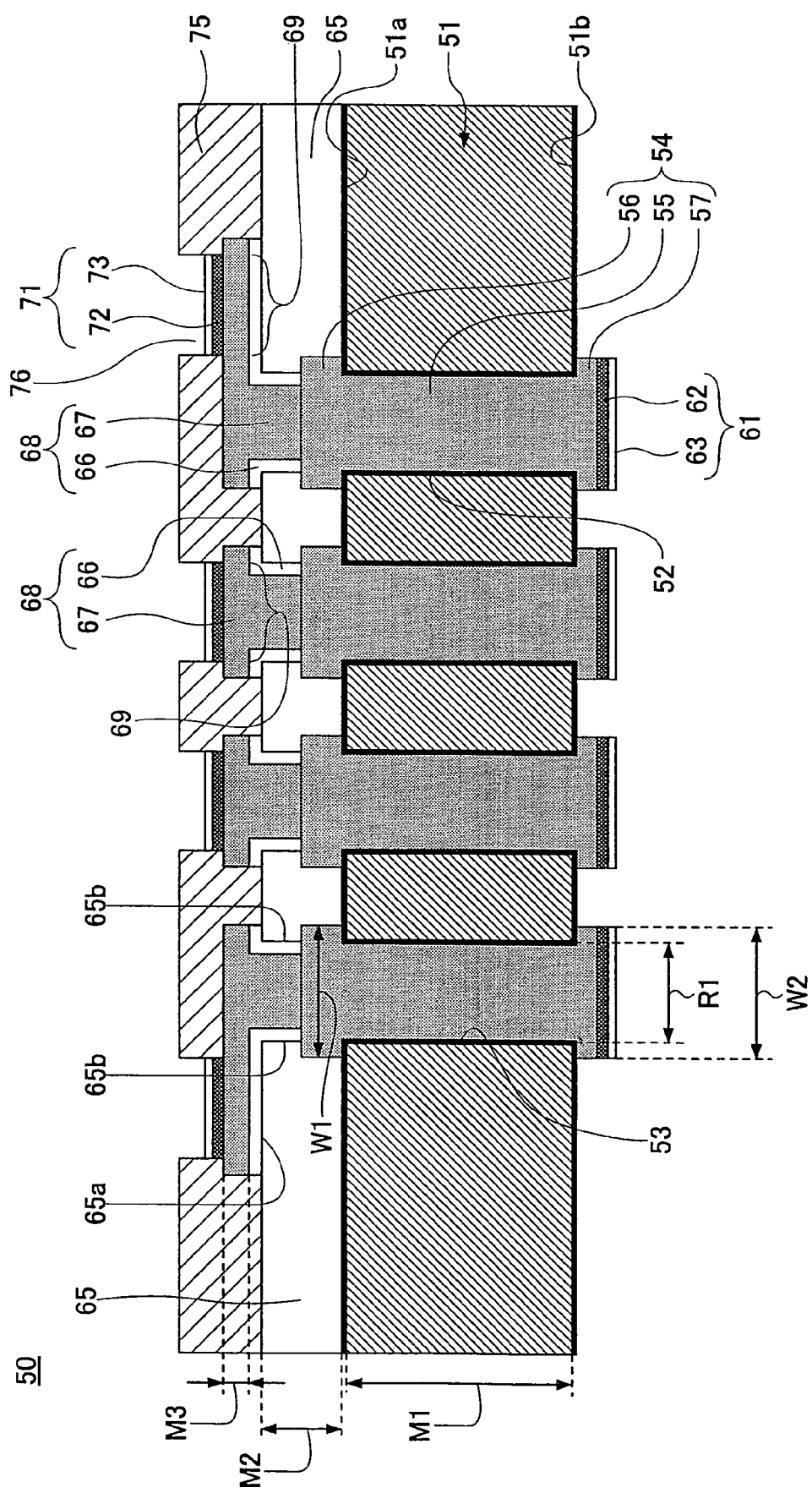
FIG. 2 is a cross-sectional diagram of the substrate according to a first embodiment of the present invention.

First, with reference to FIG. 2, a detailed description is given of a configuration of a substrate 50 according to the first embodiment of the present invention. FIG. 2 is a cross-sectional diagram of the substrate according to the first embodiment of the present invention. The substrate 50 is composed of a base member 51, an insulating layer 53, penetrating vias 54, an insulating layer 65, wirings 68, first diffusion protecting layers 61, second diffusion protecting layers 71, and solder resist 75. The substrate 50 is an interposer. As shown in FIG. 2, on the undersurface of the substrate 50, for example, MEMS (Micro Electro Mechanical Systems) wherein fine processing technology of the semiconductor is used and a semiconductor device are mounted, while on the upper side of the substrate 50, for example, another substrate such as a motherboard is connected.

The base member 51 is a silicon member which is composed of silicon. The thickness M1 of the base member 51 is, for example, 150 µm. In the base member 51, plural of through-holes 52 for disposing the penetrating vias 54 are provided so as to penetrate the base member 51. The through-hole 52 having a diameter R1 of the aperture is formed. The insulating layer 53 is provided on the surface of the base member 51 including the through-holes 52. Accordingly, by providing the insulating layer 53 on the surface of the base member 51 including the through-holes 52, the base member 51 is insulated from the penetrating via 54. It should be noted that as the base member 51, materials such as a glass material except silicon can be used. In addition to this, when materials having an insulating property such as a glass material are used, it is not necessary to provide the insulating layer 53.

The penetrating via 54 is composed of a penetrating part 55, wirings connecting part 56 as a first protrusion, and a connection pad 57 as a second protrusion. The penetrating part 55 is provided in the through-hole 52 on which the insulating layer 53 is formed, and the diameter is predetermined to be R1 (hereinafter, the diameter is referred to as "Diameter R1"). The size of the penetrating part 55 is Diameter R1.

The wirings connecting part 56 is provided on the upper edge of the penetrating part 55. The wirings connecting part 56 protrudes from a side 51a of the base member 51, and the size of the wirings connecting part 56 is wider than Diameter R1 of the penetrating part 55. In other words, the width W1 of the wirings connecting part 56 is set larger than R1 of the penetrating part 55 (W1>R1). The wirings connecting part 56 is unified with the penetrating part 55. The wirings connecting part 56 is provided for connecting a wiring 68.

The connection pad 57 is provided on the undersurface of the penetrating part 55. The connection pad 57 protrudes from a side 51b of the base member 51, and the size of the connection pad 57 is wider than Diameter R1 of the penetrating part 55. In other words, the width W2 of the connection pad 57 is set larger than Diameter R1 of the penetrating part 55 (W2>R1). The connection pad 57 is provided for connecting devices such as a semiconductor device. The penetrating part 55, wirings connecting part 56, and connection pad 57 are unified by a conductive metal layer. As the conductive metal layer, for example, a Cu layer can be used.

The first diffusion protecting layer 61 is provided on the connection pad 57. The first diffusion protecting layer 61 is formed for improving wettability of solder and protecting Cu contained in the penetrating via 54 from diffusing into the solder (drawing is omitted) connected to the connection pad 57. The first diffusion protecting layer 61 comprises, for example, a lamination layer which is composed of a Ni layer 62 and an Au layer 63. The thickness of the Ni layer 62 is, for example, 2 through 5 µm and the thickness of the Au layer 63 is, for example, 0.1 through 0.5 µm. It should be noted that instead of the above described Ni/Au layer, for example, a Ni/Pd layer and a Ni/Pd/Au layer can be used as the first diffusion protecting layer 61 (the Ni layer being the connected to the connection pad 57).

The insulating layer 65 having an open part exposing the wirings connecting part 56 is formed on the surface 51a of the base member 51. For the insulating layer 65, for example, resin can be used where one of metal particles functioning as a catalyst for plating and particles of metal compound (chloride, hydroxide, oxide and others) is dispersed. For the resin in this case, for example, epoxy resin and polyimide resin can be used. For the metal functioning as a catalyst, palladium and platinum can be used, especially, platinum is desirable. Moreover, for the metal compound, for example, palladium chloride and palladium sulfate can be used. In the present embodiment, for the insulating layer 65, epoxy resin where palladium particles are dispersed is used. By using resin including palladium as the insulating layer 65, electroless plating can be performed directly on the insulating layer 65 without performing a desmear treatment and a palladium activation treatment. Accordingly, the manufacturing steps of the substrate 50 can be simplified. The thickness M2 of the insulating layer 65 is, for example, 5 µm.

The wiring 68 is provided on the insulating layer 65 so as to be connected to the wirings connecting part 56. The wiring 68 having an external connection terminal 69 is composed of a conductive metal layer 67 and a seed layer 66. The external connection terminal 69 is provided for being connected to a substrate such as a motherboard. By providing this external connection terminal 69, the position of the external connection terminal 69 can be set corresponding to the position of the external connection terminal of the substrate like a motherboard. As the conductive metal layer 67, for example, a Cu layer can be used. When a Cu layer is used for the conductive metal layer 67, the thickness M3 of the conductive metal layer 67 is, for example, 3 through 10 µm. As the seed layer 66, for example, a Ni layer can be used. The thickness of the seed layer 66 is, for example, 0.1 µm.

The solder resist 75 having an open part 76 exposing the external connection terminal 69, is provided so as to cover the wiring 68 and insulating layer 65 except the external connection terminal 69. The solder resist 75 is provided for protecting the wiring 68.

The second diffusion protecting layer 71 is provided on the external connection terminal 69. The second diffusion protecting layer 71 is formed for improving wettability of solder and protecting Cu contained in the wiring 68 from diffusing into the solder (drawing is omitted) connected to the external connection terminal 69. The second diffusion protecting layer 71 comprises, for example, a lamination layer which is composed of a Ni layer 72 and an Au layer 73. The thickness of the Ni layer 72 is, for example, 2 through 5 µm and the thickness of the Au layer 73 is, for example, 0.1 through 0.5 µm. It should be noted that instead of the above described Ni/Au layer, for example, a Ni/Pd layer and a Ni/Pd/Au layer can be used as the second diffusion protecting layer 71 (the Ni layer must be connected to the external connection terminal 69).

Figure 3:
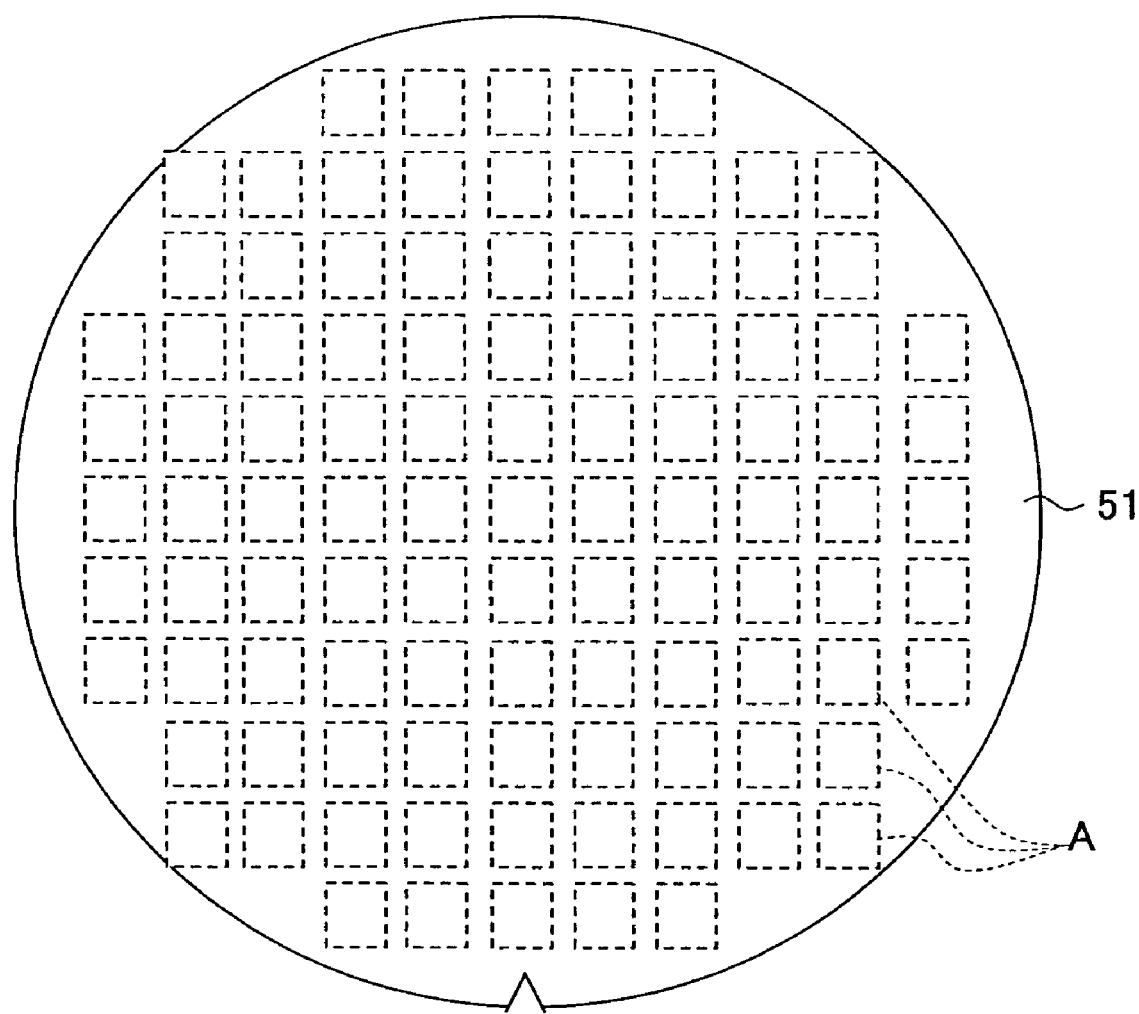
FIG. 3 is a plan view of a base member for manufacturing the substrate according to the present embodiment.

FIG. 3 is a plan view of a base member 51 for manufacturing the substrate 50 according to the present embodiment. "A" shown in FIG. 3 is an area where the substrate 50 is formed (hereinafter, "A" is referred to as "Substrate Forming Area A"). As shown in FIG. 3, according to the present embodiment, a silicon base member (silicon wafer) having a plurality of Substrate Forming Areas A is used as the base member 51. As above described, the silicon member is used as the base member 51, and after the respective manufacturing steps are performed, the base member 51 is cut into a plurality of pieces, and thus, plural of the substrates 50 are manufactured all at once. Accordingly, the productivity of manufacturing the substrate 50 is improved.

Next, with reference to FIGS. 4 through 29, a description is given of a method for manufacturing the substrate 50 according to the first embodiment. FIGS. 4 through 29 are diagrams showing the manufacturing steps of the substrate 50 according to the first embodiment. It should be noted that an example is given where a silicon member is used as the base member 51.

Figure 4:
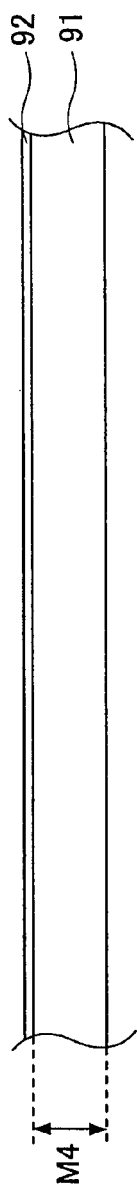
FIGS. 4 through 29 are diagrams showing the manufacturing steps of the substrate according to the first embodiment.

First, as shown in FIG. 4, an adhesive 92 is provided on a support board 91. The support board 91 is provided for supporting the base member 51. As the support board 91, for example, a glass member and a silicon member (specifically a silicon wafer) can be used. When the silicon member is used as the support board 91, the thickness M4 of the support board 91 is, for example, 725 µm. The adhesive 92 is provided on the support board 91 for bonding a metal foil 93 which is described below. As the adhesive 92, for example, a thermo peal tape and a thermal ablation adhesive can be used which lose adhesion when being heated.

Figure 5:
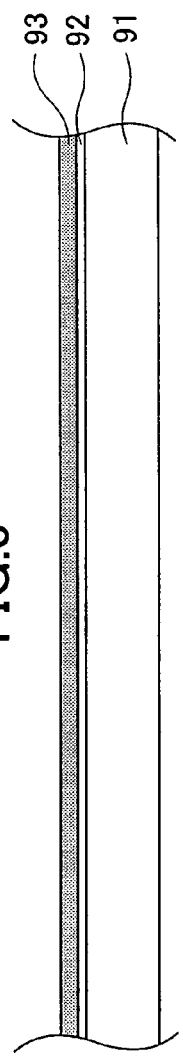
Figure 6:
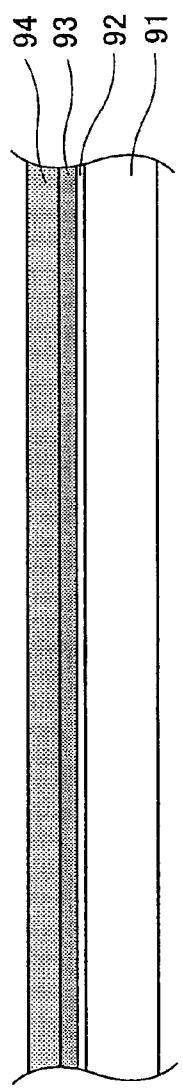

Next, as shown in FIG. 5, a metal foil 93 such as a Cu layer is bonded to the support board 91 via the adhesive 92 (the metal foil providing step). Then, as shown in FIG. 6, a first resist layer 94 which is not in the exposure state is formed on the metal foil 93 (the first resist layer forming step). For the first resist layer 94 which is a resist having adhesion, for example, a photosensitive dry film resist and a liquid resist can be used.

Figure 7:
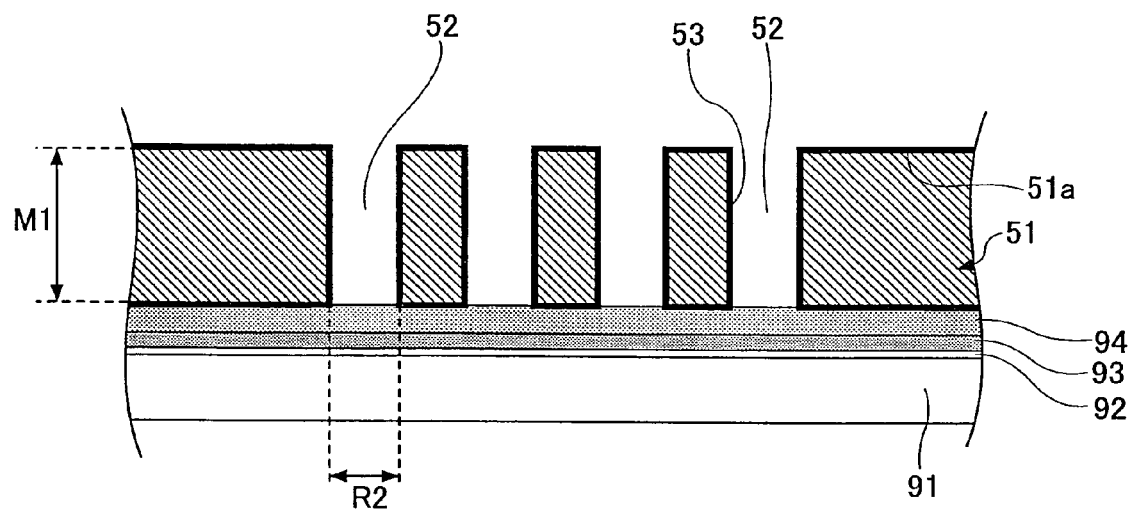

By using the first resist layer 94 having adhesion, the base member 51 having through-holes 52 can be fixed on the support board 91 via the first resist layer 94 (as shown in FIG. 7). The thickness of the first resist layer is, for example, 10 through 15 µm. Moreover, instead of the first resist layer 94, another adhesive such as epoxy and polyimide can be used if the adhesive can be dissolved by some treatment liquid.

Next, as shown in FIG. 7, the through-hole 52 having a diameter R2 (R1=R2) is formed, and the base member 51 where the insulating layer 53 is formed so as to cover the surface of the base member 51 (including the base member 51 part corresponding to the through-hole 52), is provided on the first resist layer 94 having adhesion and fixed (the base member disposing step). The through-hole 52 can be formed by, for example, one of drill processing, laser processing, and anisotropic etching. Moreover, the diameter R2 of the through-hole 52 can be selected properly from the range of, for example, 10 through 60 µm. As the insulating layer 53, for example, an oxide layer ($SiO_2$) formed by a CVD method and a thermal oxide layer ($SiO_2$) formed by an oxidizing furnace can be used. Furthermore, the thickness M1 of the base member 51 is, for example, 150 µm.

Figure 8:
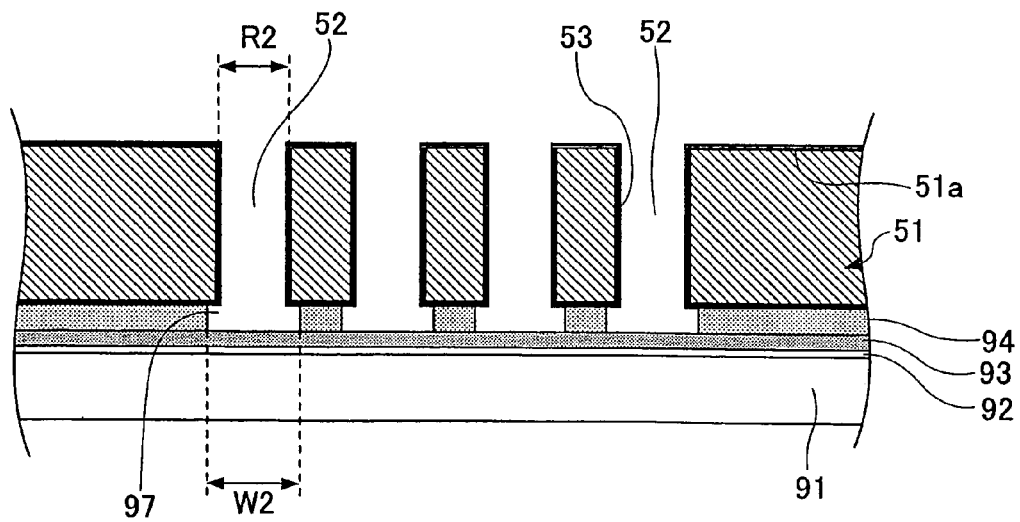

Next, as shown in FIG. 8, a developer is supplied to the inside of the through-hole 52, and then, the developer dissolves the first resist layer 94 exposed by the through-hole 52 so as to form a space 97 (the space forming step). The space 97 is wider than the diameter R2 of the through-hole 52, and the width W2 of the space 97 is larger than the diameter R2 of the through-hole 52 (W2>R2). As a method for supplying the developer into the through-hole 52, for example, a dip development method where a structure shown in FIG. 7 is dipped into the developer and a spray development method where the developer is sprayed like a shower on the through-hole 52 are applied.

In either method of development, by controlling the dipping time in the developer, the space can be formed. As a condition for forming the space 97 by the spray development method, for example, a pressure of spraying the developer is 2.0 kgf/cm², a temperature is 25 through 30° C., and a developer spraying time is 6 min. It should be noted that "a size of a through-hole" is the diameter R2 of the through-hole 52. Then, a thermal treatment (a first thermal treatment) is performed on the structure as shown in FIG. 8, and a polymerization reaction is carried out on the first resist layer 94 which is not in the exposure state so as to harden the first resist layer 94 (the first resist layer hardening step). Thus the first resist layer is hardened so that the first resist layer can be tolerant of the plating solution.

Figure 9:
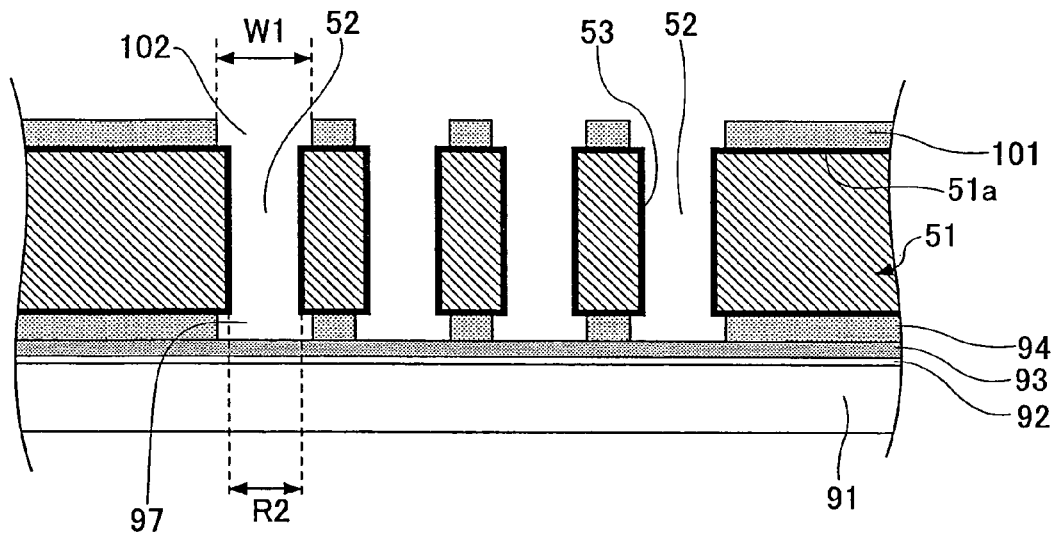

Next, as shown in FIG. 9, a through-hole 52 is exposed on the insulating layer 53 formed on the surface 51a of the base member 51, and a second resist layer 101 having an open part 102 wider than the diameter R2 of the through-hole 52 is formed (the second resist layer forming step). The diameter W1 of the first open part, i.e. the open part 102 is formed larger than the diameter R2 of the through-hole 52 (W1>R2).

Figure 10:
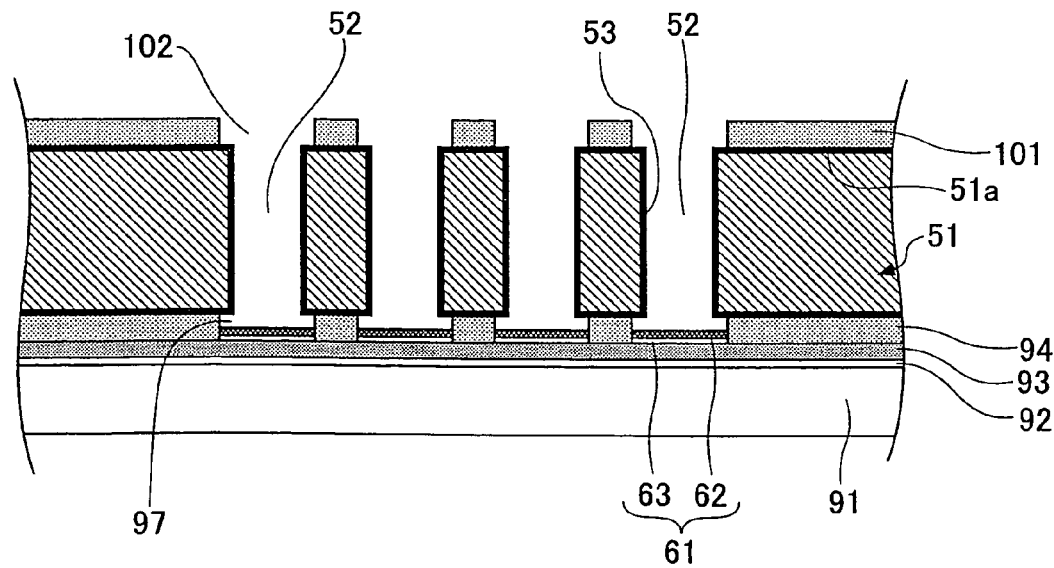

Next, as shown in FIG. 10, by using the metal foil 93 as a power supply layer, an Au layer 63 and a Ni layer 62 are separated out in turn on the metal foil 93 according to the electrolytic plating method and grown, and thus the first diffusion protecting layer 61 is formed (the first diffusion protecting layer forming step). The thickness of the Au layer 63 is, for example, 0.1 through 0.5 µm, and the thickness of the Ni layer 62 is, for example, 2 through 5 µm. Accordingly, the first diffusion protecting layer 61 is formed by the electrolytic plating method; thus the diffusion protecting layer having a layer superior to the layer formed by the electroless plating method can be obtained.

Figure 11:
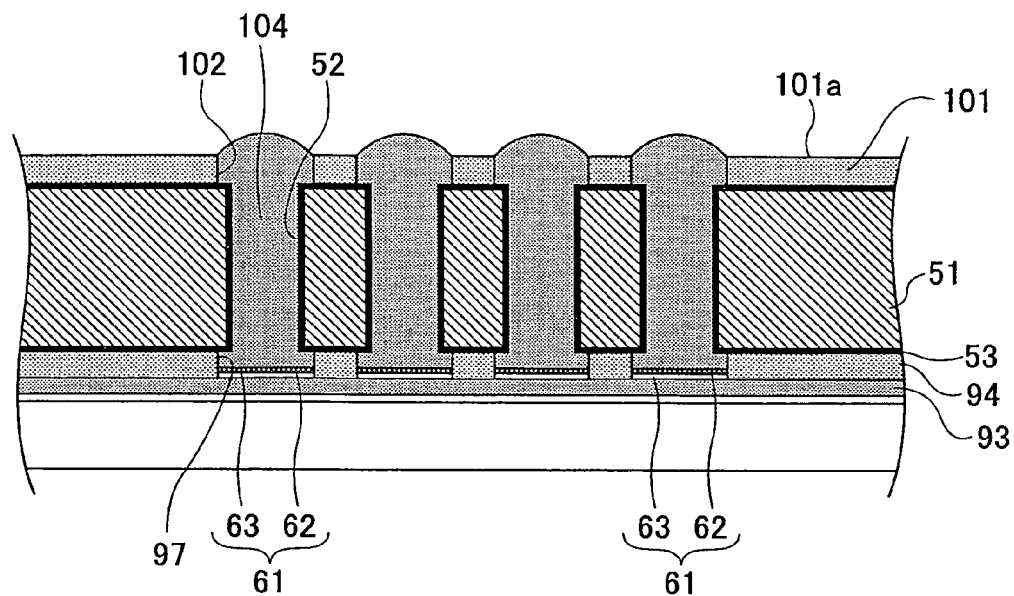

Next, as shown in FIG. 11, by using the metal foil 93 and the Ni layer 62 as a power supply layer, a conductive metal layer 104 is separated out and grown so as to fill the space 97, through-hole 52 and open part 102 (the conductive metal layer forming step). In this case, the conductive metal layer 104 protrudes from the surface 101a of the second resist layer 101. As the conductive metal layer 104, for example, a Cu layer can be used.

Figure 12:
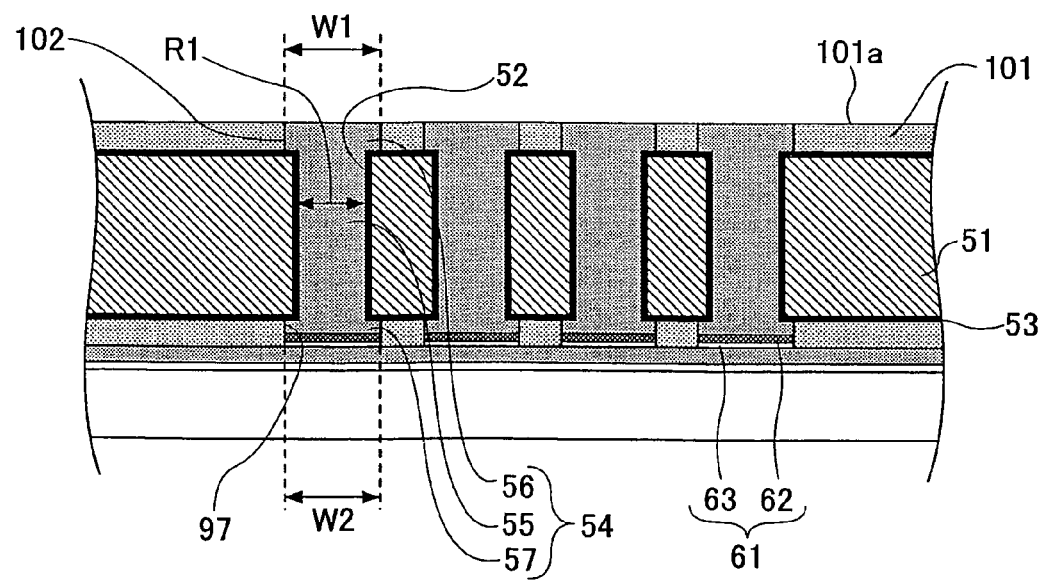

Next, as shown in FIG. 12, the conductive metal layer 104 protruding from the surface 101a of the second resist layer 101 is ground to be removed so that the conductive metal layer 104 and the surface 101a of the second resist layer 101 become flat. Accordingly, the following components are formed all at once: the connection pad 57 having the width W2 in the space 97, the penetrating part 55 having the diameter R1 in the through-hole 52, and the wirings connecting part 56 (the first protrusion) having the width W1 in the open part 102. And thus, the penetrating via 54 is formed. The widths W1 and W2 are wider than the diameter R1 of the penetrating part 55.

Accordingly, by forming the connection pad 57 and wirings connecting part 56 wider than the diameter R1 of the penetrating part 55 in the penetrating via 54, water is prevented from infiltrating the gap between the penetrating part 55 and the base member 51, and the degradation of the penetrating via 54 is controlled. Therefore, the electric connection reliability of the penetrating via 54 connected to the wiring 68 is improved.

Moreover, the metal foil 93 is used as a power supply layer, the conductive metal layer 104 is separated and grown on the metal foil 93 so as to fill the space 97, through-hole 52 and the first open part 102, and thus a void (cavity) is prevented from forming in the penetrating via 54.

Figure 13:
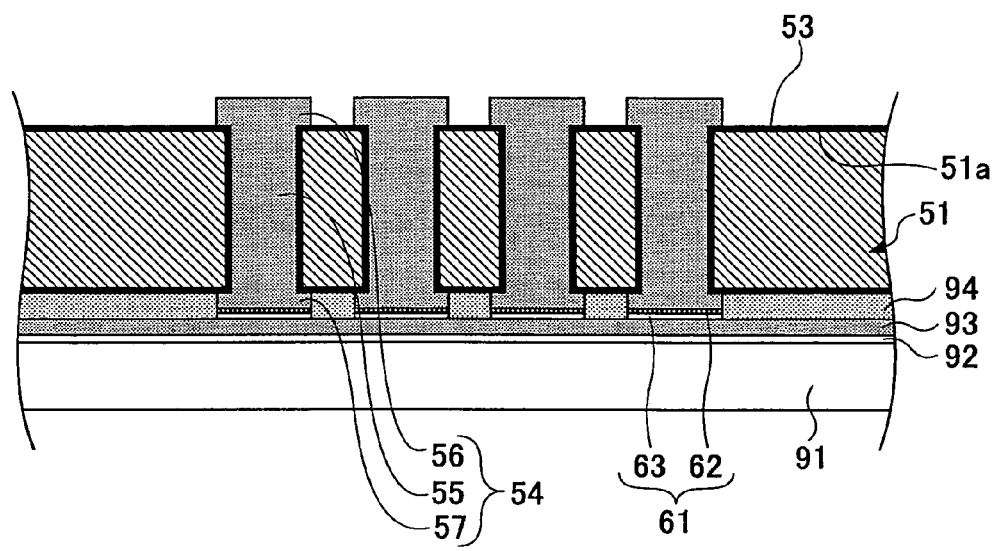
Figure 14:
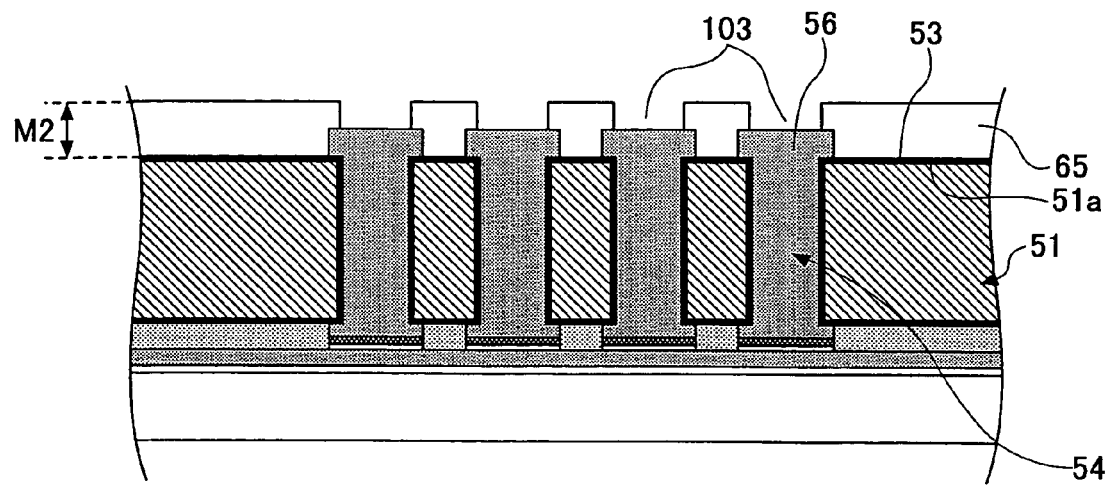

Next, as shown in FIG. 13, the second resist layer 101 is removed by a resist stripper (the second resist layer removing step). Then, as shown in FIG. 14, an insulating layer 65 having an open part 103 exposing the wirings connecting part 56 is provided on the surface 51a of the base member 51 (the insulating layer forming step). In the present embodiment, an epoxy resin containing palladium particles therein is used for the insulating layer 65. The thickness M2 of the insulating layer 65 is, for example, 5 µm.

Figure 15:
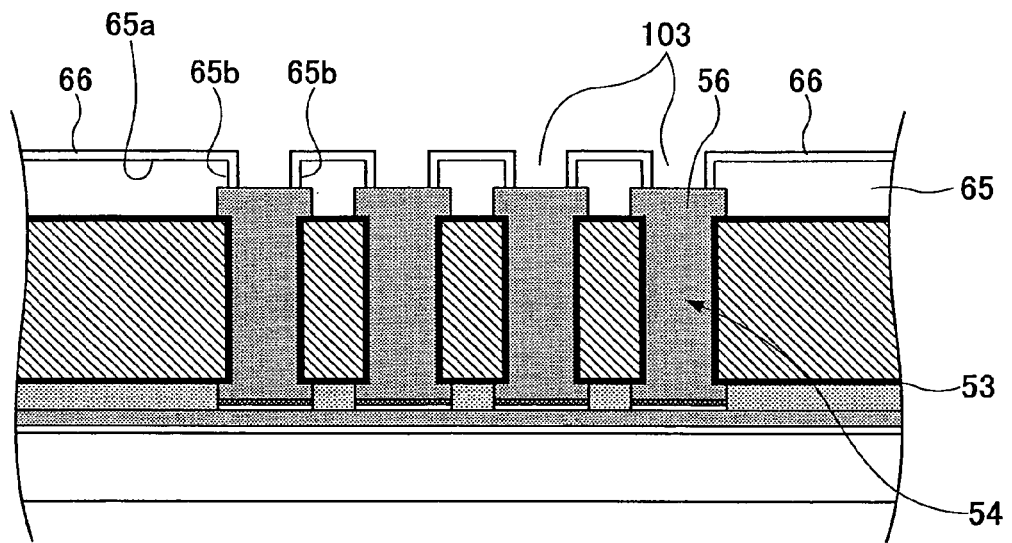

As shown in FIG. 15, a seed layer 66 is formed on the upper surface 65a and the lateral surface 65b of the insulating layer 65 by the electroless plating method (the seed layer forming step). It should be noted that conventionally, before forming a seed layer on resin by the electroless plating method, a desmear treatment is performed on the surface of the resin (insulating layer) and roughed in advance, and then a palladium activation treatment is performed on the surface of the resin. The palladium activation treatment is dipping a sample to be plated in either a catalyzing treatment solution or an accelerating treatment solution, and then separating out the palladium which will be a core to be plated by the electroless plating method on the surface of the resin. According to the conventional technology, a plated layer can not be formed by the electroless plating method until the palladium activation treatment is performed. Therefore, according to the conventional technology, the steps are very troublesome.

On the contrary, according to the present embodiment, an epoxy resin containing the palladium particles therein is applied to the insulating layer, so that the seed layer 66 can be formed directly on the insulating layer by the electroless plating method without performing the desmear treatment and palladium activation treatment in advance. Accordingly, the manufacturing steps of the substrate 50 can be simplified. As the seed layer 66, for example, a Ni layer can be used. When resin containing palladium particles therein is used for the insulating layer 65, a Ni—B layer can be formed.

Figure 16:
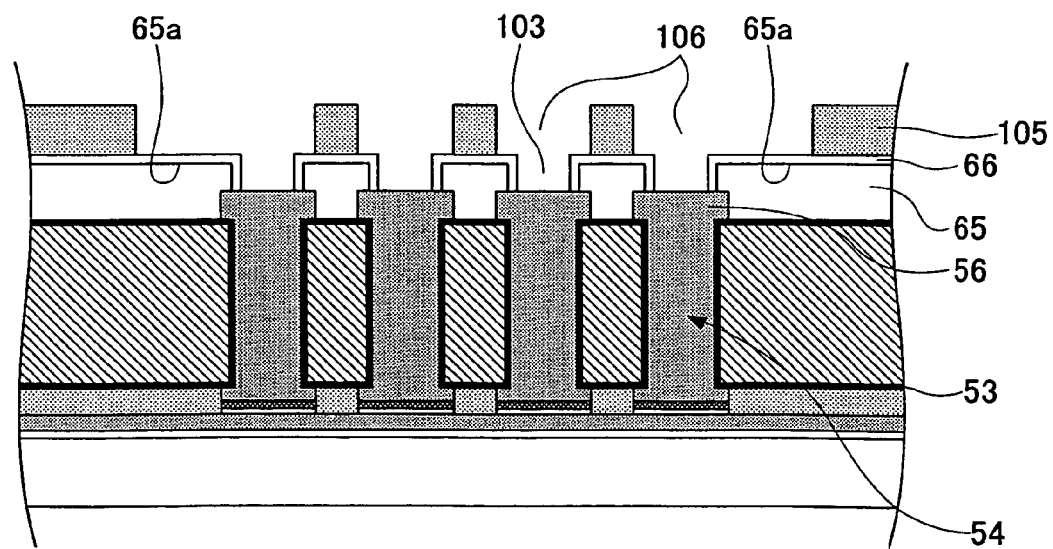
Figure 17:
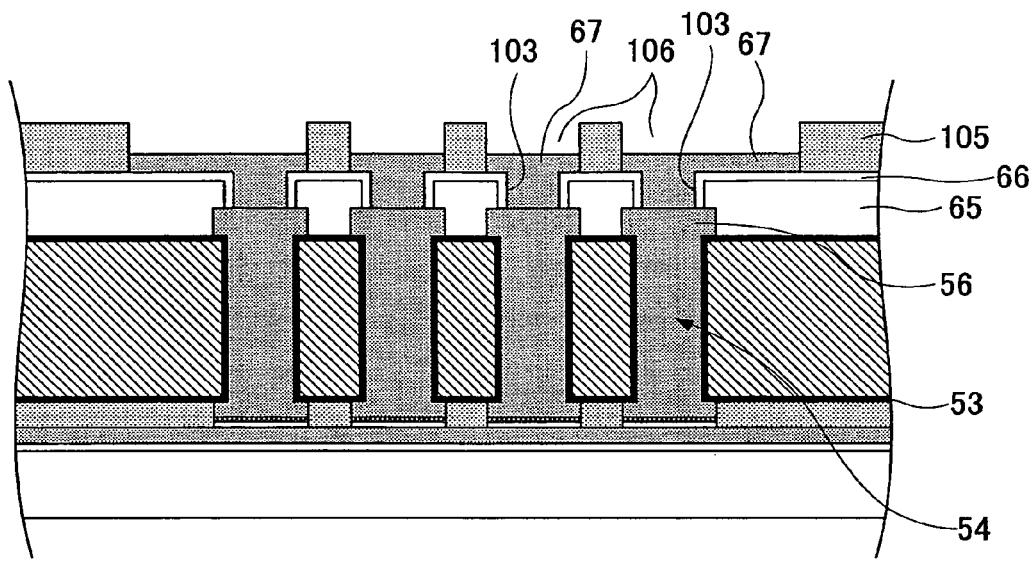

Next, as shown in FIG. 16, on the seed layer 66, a dry film resist 105 having an open part 106 corresponding to the area where the wiring 68 is provided is formed. The thickness of the dry film resist 105 is, for example, 10 through 15 µm. Then, as shown in FIG. 17, by using the wirings connecting part 56 and seed layer 66 as a power supply layer, a conductive metal layer 67 is separated out on open parts 103 and 106 by the electrolytic plating method.

Figure 18:
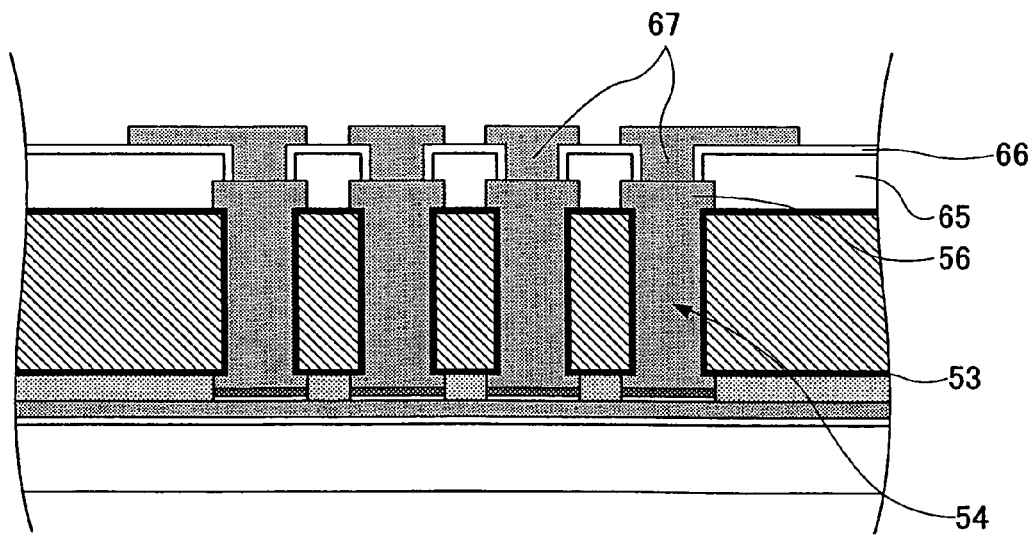
Figure 19:
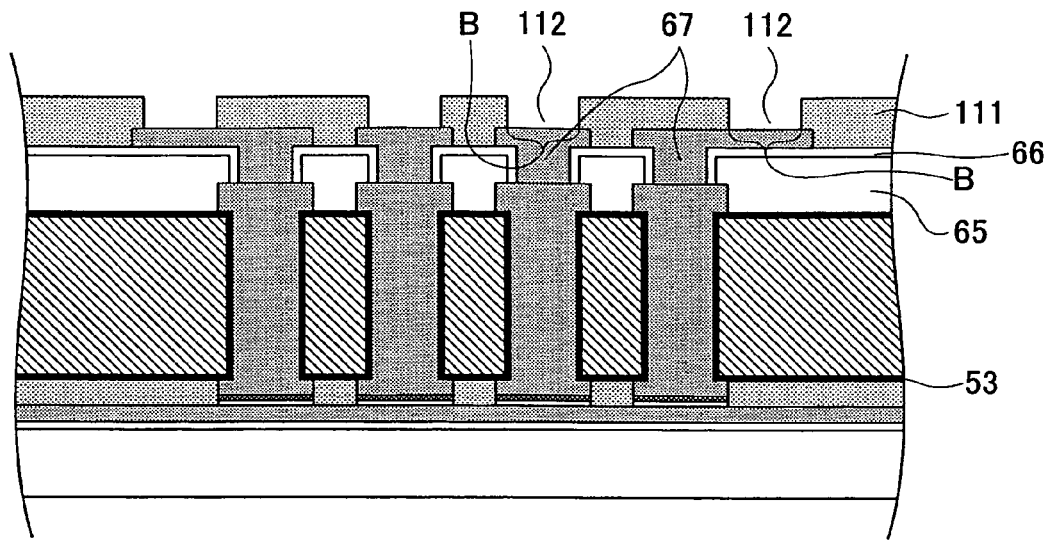

Accordingly, the conductive metal layer 67 and the penetrating via 54 are electrically connected. After the conductive metal layer 67 and the penetrating via 54 are connected, as shown in FIG. 18, the dry film resist 105 is removed by the resist stripper. Then, as shown in FIG. 19, on the structure shown in FIG. 18, a dry film resist 111 is formed exposing the conductive metal layer 67 corresponding to the area B where an external connection terminal 69 is to be formed. Open parts 112 are formed in the dry film resist 111, and the conductive metal layer 67 corresponding to the area B is exposed from the open part 112.

Figure 20:
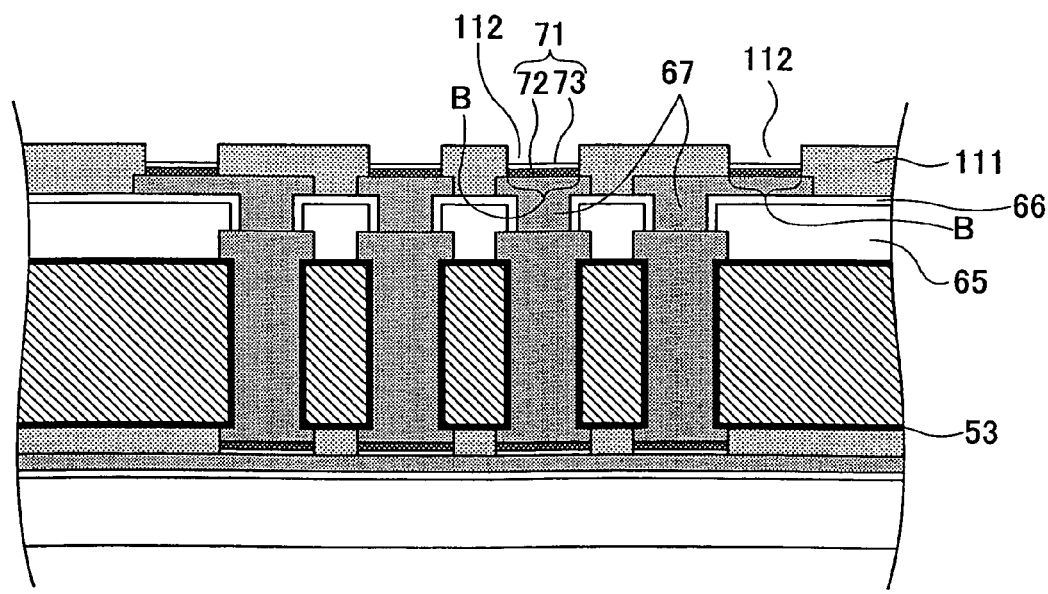

Next, as shown in FIG. 20, by using the conductive metal layer 67 as a power supply layer, according to the electrolytic plating method, a Ni layer 72 and an Au layer 73 are separated out in turn and grown on the conductive metal layer 67 exposed from the open part 112 so as to form a second diffusion protecting layer 71 (the second diffusion protecting layer forming step). The thickness of the Ni layer 72 is, for example, 2 through 5 µm, and the thickness of the Au layer 73 is, for example, 0.1 through 0.5 µm. Accordingly, the second diffusion protecting layer 71 is formed by the electrolytic plating method, thus the second diffusion protecting layer 71 having a layer superior to the layer formed by the electroless plating method can be obtained. The dry film resist 111 is removed after the second diffusion protecting layer 71 is formed.

Figure 21:
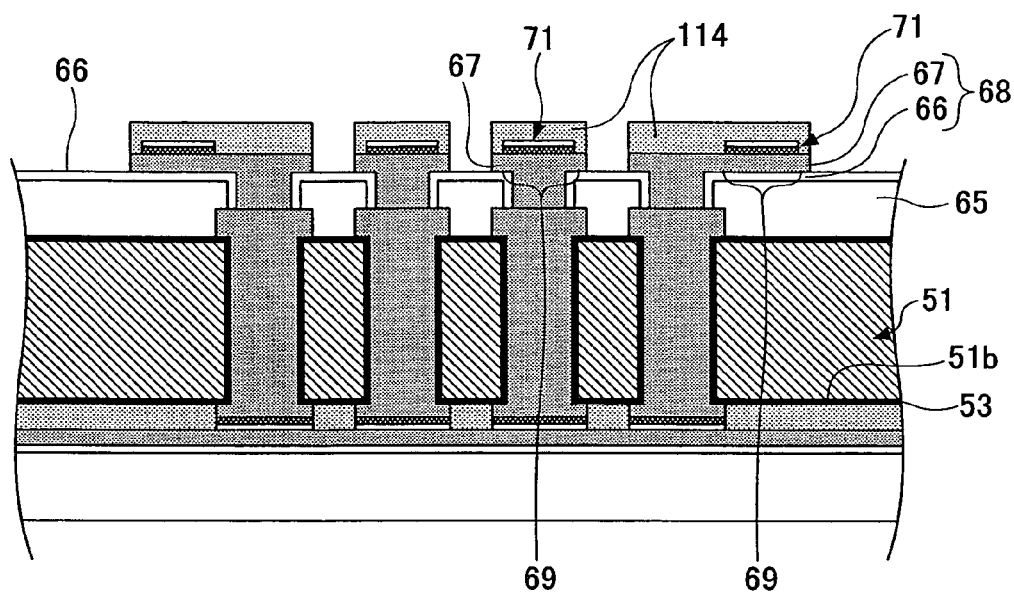
Figure 22:
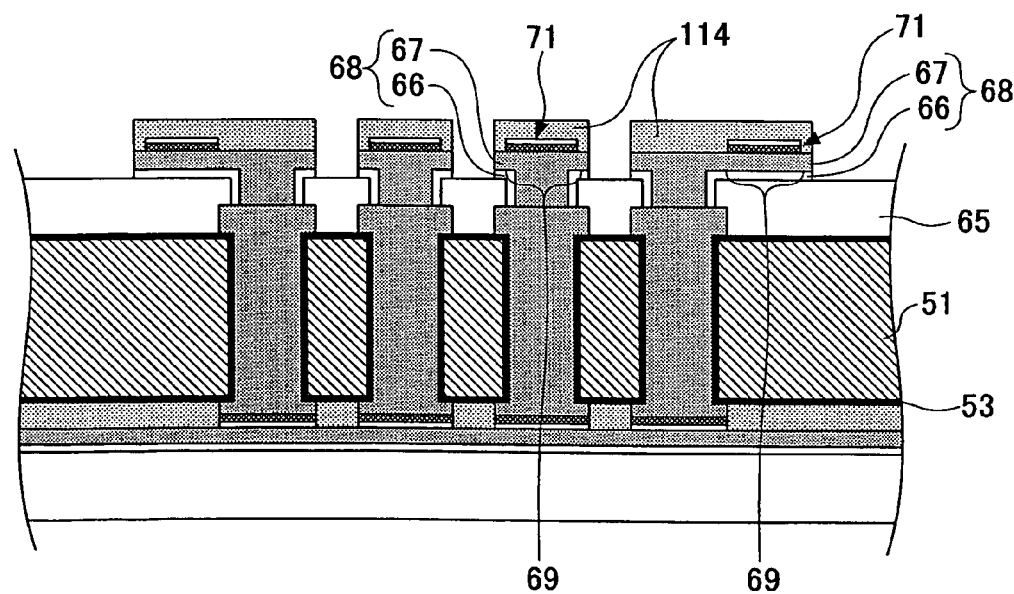
Figure 23:
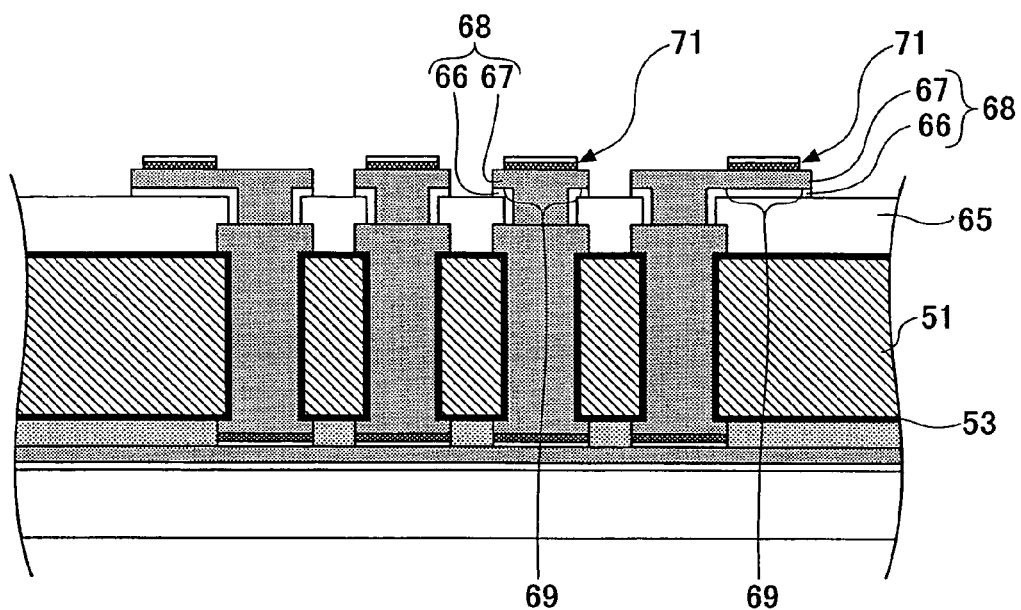

Next, as shown in FIG. 21, a dry film resist layer 114 is formed so as to cover only the conductive metal layer 67 and the second diffusion protecting layer 71. Then, as shown in FIG. 22, the seed layer 66 formed on the insulating layer 65 is removed by etching. Accordingly, the external connection terminal 69 is provided and the wiring 68 including the seed layer 66 and conductive metal layer 67 is formed. After the seed layer 66 is removed, as shown in FIG. 23, the dry film resist 114 is removed by the resist stripper.

Figure 24:
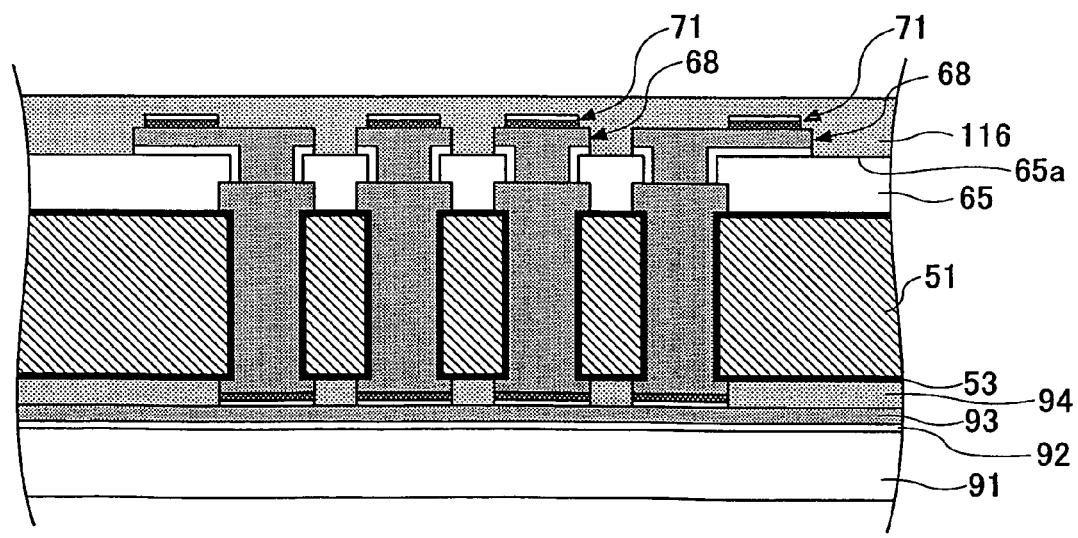
Figure 25:
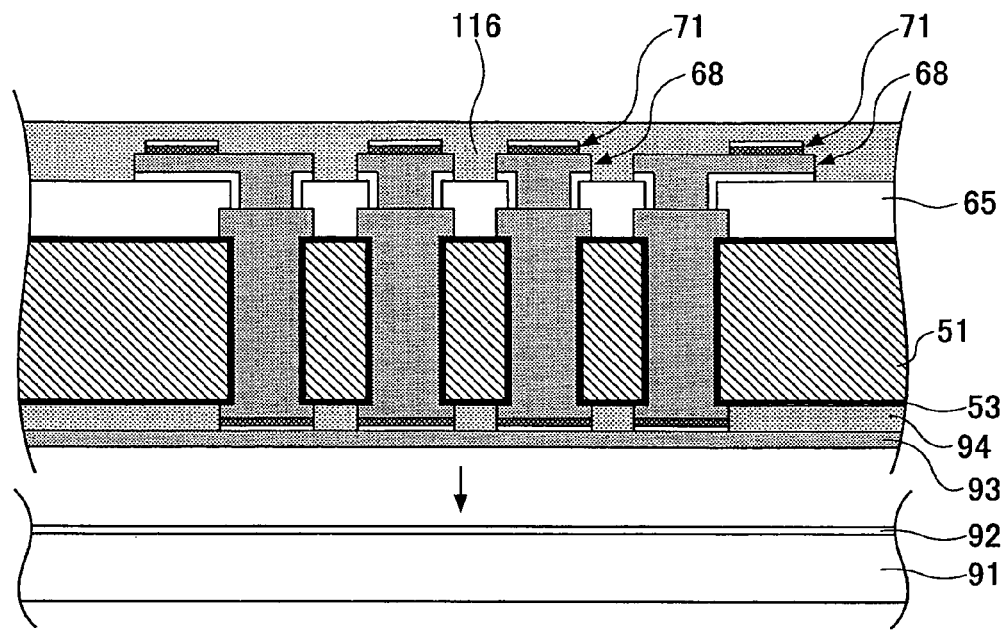

Next, as shown in FIG. 24, a heat-resistant protective member, i.e. a temperature-resistant tape 116 is attached so as to cover the wiring 68, second diffusion protecting layer 71 and an upper surface 65a of the insulating layer 65 (the protective member disposing step). The temperature-resistant tape 116 is a tape having a resistance against the etchant. Accordingly, the wiring 68 and the second diffusion protecting layer 71 are covered by the temperature-resistant tape 116 so as to protect the wiring 68 and the second diffusion protecting layer 71 from the heat generated in a second thermal treatment (as shown in FIG. 25) performed in removing the support board 91 from the base member 51. As the temperature-resistant tape 116, for example, a PET and a PEN which are flame retardant can be used. It should be noted that the temperature-resistant tape 116 is provided so as to cover at least the wiring 68 and second diffusion protecting layer 71.

Figure 26:
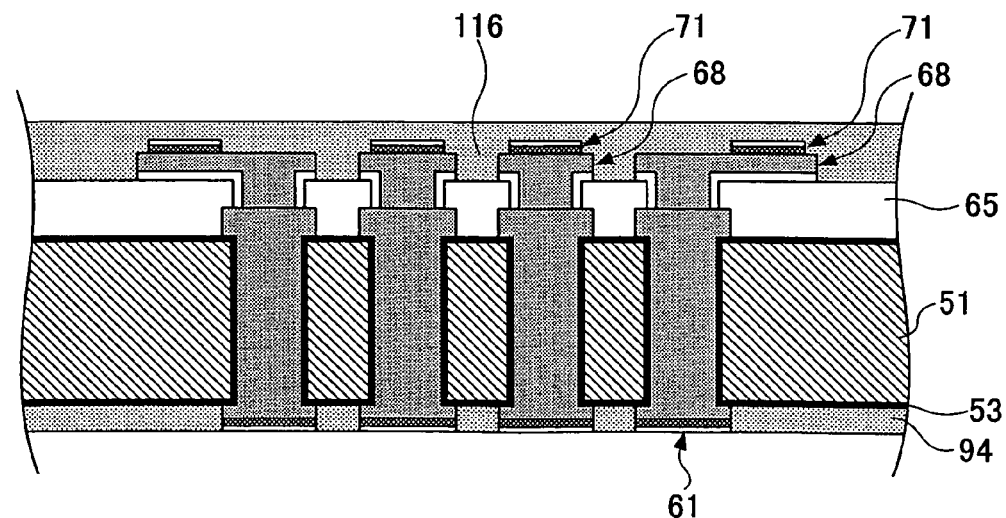

Next, as shown in FIG. 25, the structure shown in FIG. 24 is heated (the second thermal treatment) and the adhesive 92 and support board 91 are removed from the base member 51 (the support board removing step). According to the present embodiment, a thermo peal tape which loses adhesion when being heated is used as the adhesive 92. The conditions of the second thermal treatment are, for example, a heating temperature of 150° C. and a heating time of 30 min. Then, as shown in FIG. 26, the metal foil 93 is removed by etching (the metal foil removing step). Accordingly, the first resist layer 94 and the first diffusion protecting layer 61 are exposed. As described above, the wiring 68 is covered by the temperature-resistant tape 116 having a resistance against the etchant, and thereby, the wiring 68 is not etched.

Figure 27:
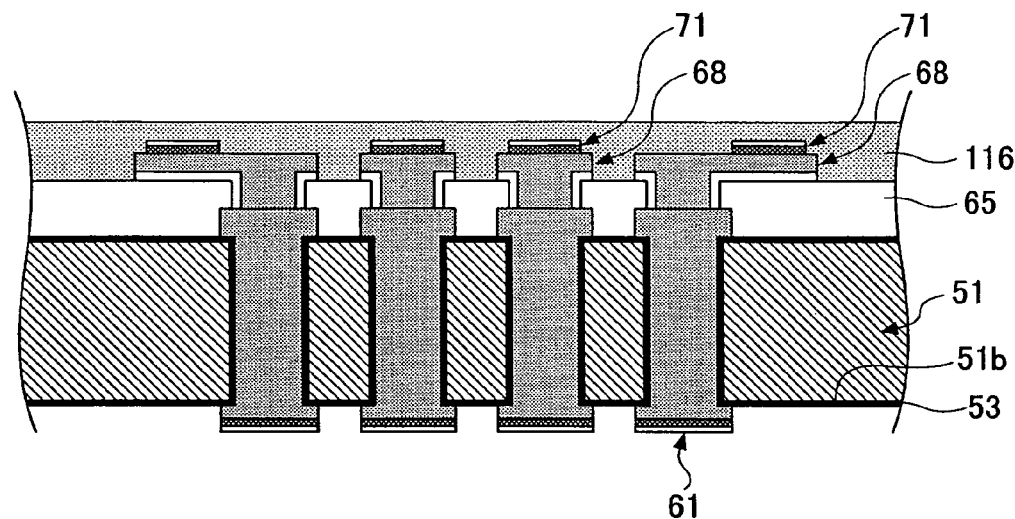
Figure 28:
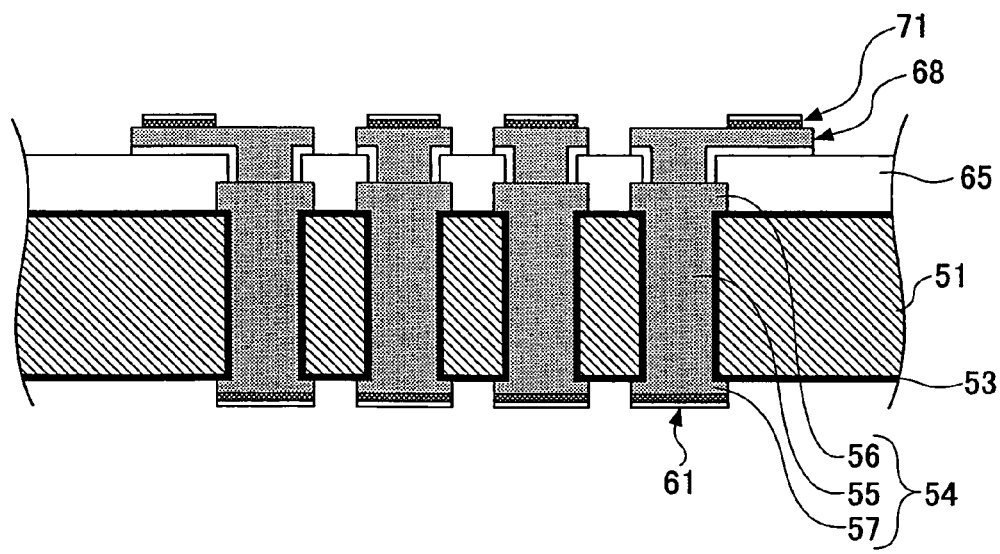
Figure 29:
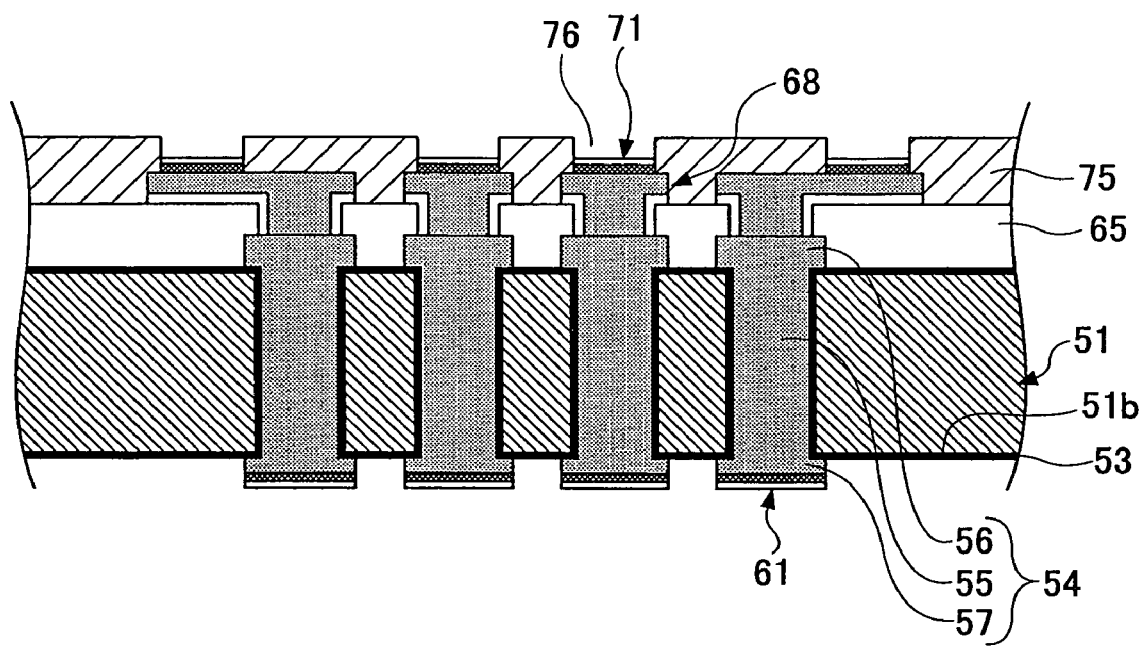

Next, as shown in FIG. 27, the first resist layer 94 is removed by the ablation liquid. Then, as shown in FIG. 28, the temperature-resistant tape 116 is removed. After the tape is removed, as shown in FIG. 29, solder resist 75 is provided so as to expose the second diffusion protecting layer 71 and cover the wiring 68 and insulating layer 65. The solder resist 75 has open parts 76 exposing the second diffusion protecting layer 71. After the solder resist 75 is formed, the base member 51 is diced into a plurality of the substrates 50 as shown in FIG. 2.

As the described manufacturing steps, the penetrating via 54 is formed including the wiring connection part 56 which is formed on one edge of the penetrating part 55 and the wiring connection part 56 is wider than the diameter R1 of the penetrating part 55, and the connection pad 57 which is formed on the other edge of the penetrating part 55 and has a shape wider than the diameter R1 of the penetrating part 55. Accordingly, water is prevented from infiltrating a gap between the penetrating part 55 and the base member 51, and degradation of the penetrating via 54 is controlled; therefore, the electric connection reliability of the penetrating via 54 connected to the wiring 68 is improved. Moreover, the wiring 68 is connected to the wirings connecting part 56 having a shape wider than the diameter R1 of the penetrating part 55, and thus, the wirings connecting part 56 is easily connected to the wiring 68.

It should be noted that in the substrate shown in FIG. 13, a diffusion protecting layer is formed on the connecting part 56 by electrolytic plating method without forming the above described layers such as a conductive metal layer. Then, the support board 91, the adhesive 92, the metal foil 93, and the first resist layer 94 are removed so as to obtain a substrate having only the penetrating via 54. This substrate can also be applied to the present invention.

Second Embodiment

Next, with reference to FIGS. 30 through 36, a description is given of another method for manufacturing the substrate 50. FIGS. 30 through 36 are diagrams showing the other method's manufacturing steps of the substrate 50.

Figure 30:
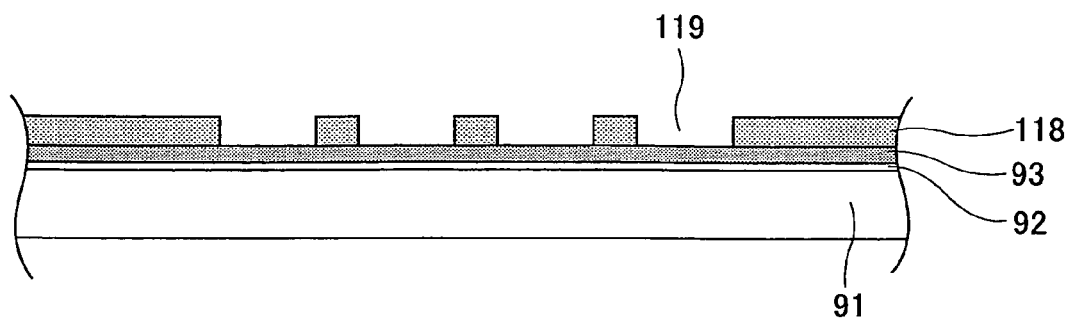
FIGS. 30 through 36 are diagrams showing the other manufacturing steps of the substrate.

First, as shown in FIG. 30, the adhesive 92 is provided on the support board 91 and the metal foil 93 such as Cu is attached on the adhesive 92 (the metal foil disposing step). Then, a dry film resist 118 having an open part 119 is provided on the metal foil 93. The open part 119 exposes the metal foil 93.

Figure 31:
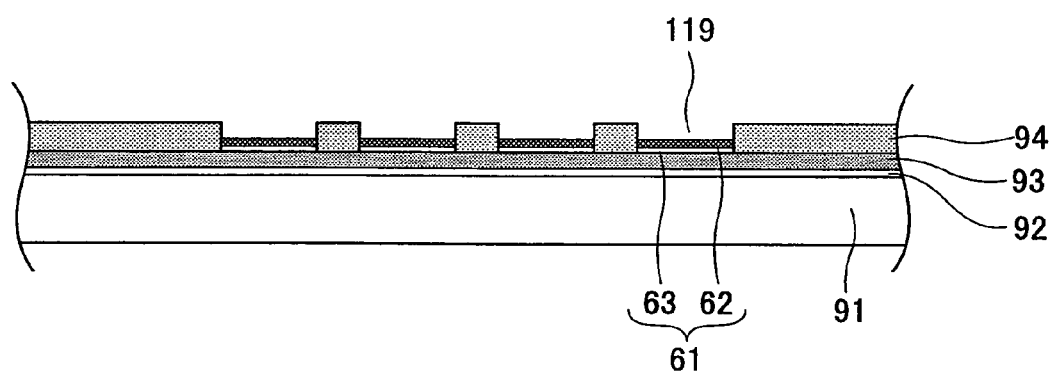
Figure 32:
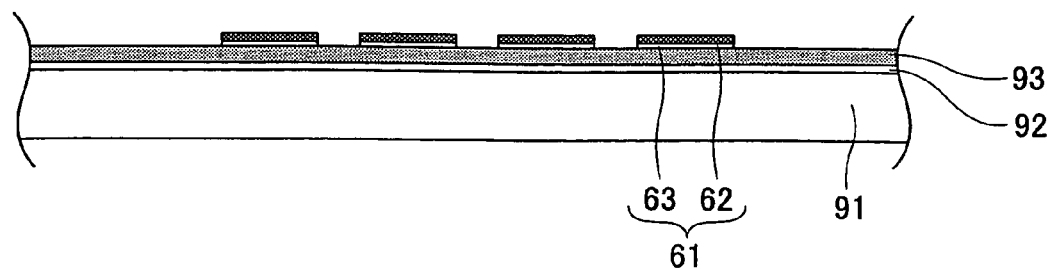

Next, as shown in FIG. 31, by using the metal foil 93 as a power supply layer, an Au layer 63 and a Ni layer 62 are separated out in turn and grown on the metal foil 93 exposed from the open part 119 so as to form a first diffusion protecting layer 61 (the first diffusion protecting layer forming step). And then, as shown in FIG. 32, the dry film resist 118 is removed by the resist stripper.

Figure 33:
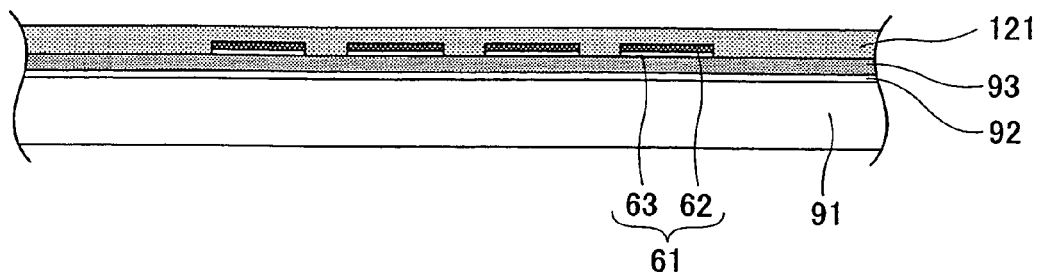

Next, as shown in FIG. 33, a first resist layer 121 which is not in the exposure state is provided on the metal foil 93 so as to cover the first diffusion protecting layer 61 (the first resist layer forming step). As the first resist layer 121 which is a resist having adhesion, for example, photosensitive dry film resist can be used. The thickness of the first resist layer 121 is, for example, 10 μm through 15 μm.

Figure 34:
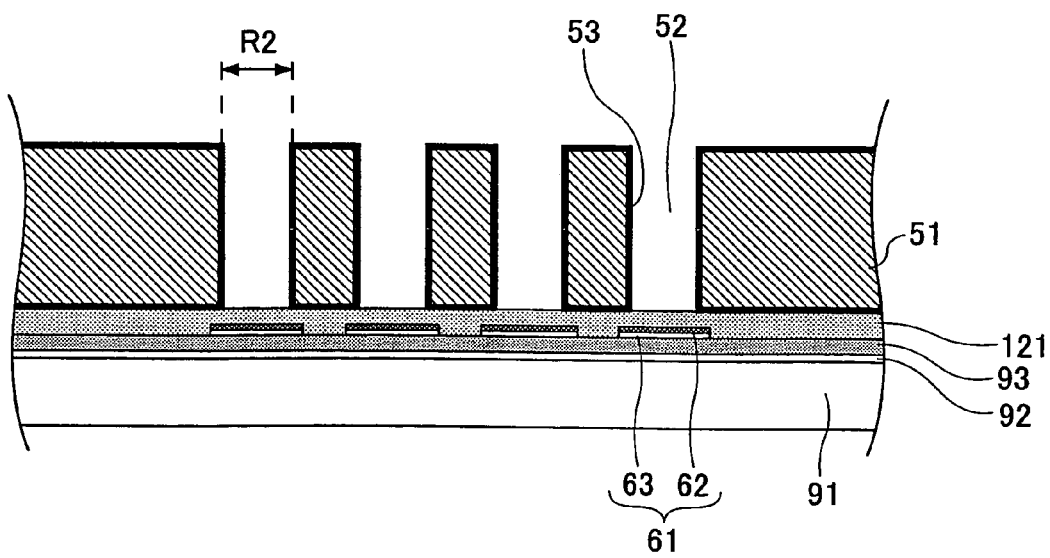

Next, as shown in FIG. 34, a through-hole 52 having a diameter R2 is formed and a base member 51 where an insulating layer 53 is formed so as to cover a surface of the base member 51 (including the base member part corresponding to the through-hole 52) is disposed on the first resist layer 121 having adhesion and fixed on the first resist layer 121 (the base member disposing step).

Figure 35:
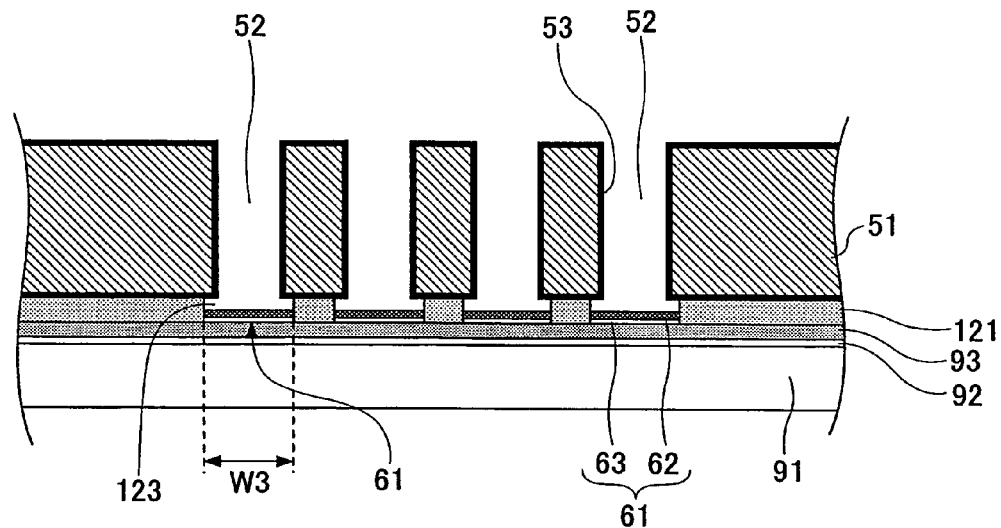

Next, as shown in FIG. 35, the developer is supplied into the through-hole 52, and the developer dissolves the first resist layer 121 exposed on the through-hole 52 so as to form a space 123 (the space forming step). The space 123 is a space wider than the diameter R2 of the through-hole 52, and the width W3 of the space 123 is larger than the diameter R2 of the through-hole 52 (W3>R2). The space 123 is exposed from the Ni layer 62. As for a method for supplying the developer in the through-hole 52, the dip development and the spray development described in the first embodiment can be applied.

Figure 36:
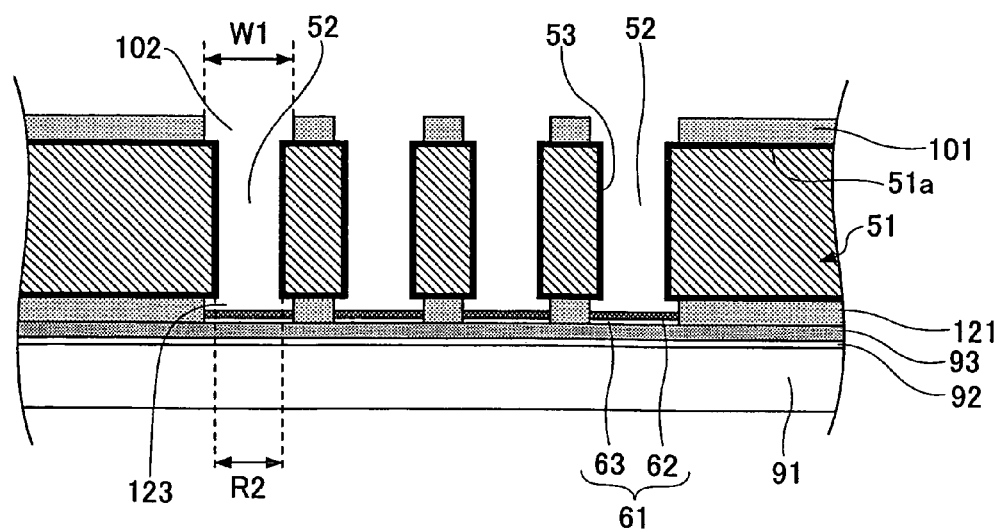

Next, as shown in FIG. 36, the through-hole 52 is exposed on the insulating layer 53 formed on the surface 51a of the base member 51, and the second resist layer 101 having an open part 102 wider than the diameter R2 of the through-hole 52 is formed (the second resist layer forming step). The width W1 of the open part 102 which is the first open part is larger than the diameter R2 of the through-hole 52 (W1>R2). Then, the substrate 50 can be manufactured by steps similar to those in FIGS. 11 through 29.

Accordingly, by inserting another step between the first diffusion protecting layer forming step and the conductive metal layer forming step (in the present embodiment, for example, the first resist layer forming step), the plating solution used to form Ni layer 63 is prevented from being mixed with the plating solution used to form a conductive metal layer 104. Therefore, the conductive metal layer 104 having an excellent layer can be formed.

Further, the present invention is not limited to these embodiments, but variations and modifications may be made without departing from the scope of the present invention. It should be noted that the wiring 68 is formed on only the upper surface 51a of the base member 51, but a wiring (including an external connection terminal) connected to the connection pad 57 can also be provided according to the similar manufacturing step shown in FIGS. 14 through 23. Thus, the wirings are disposed on both sides 51a and 51b of the base member 51 so as to connect various substrates such as a motherboard, semiconductor device, and MEMS. Therefore, the scope of the application of the substrate can be expanded and the electrical connection reliability between the wirings formed on both sides of the base member 51 can be improved.

The present invention can be applied to a substrate improving the electrical connection reliability of the penetrating via connecting the wiring and a method for manufacturing the same.

According to at least one embodiment of the present invention, a diffusion protecting layer is provided on the external connection terminal and on the second protrusion, and when the wiring and the penetrating via contain Cu therein, the Cu contained in the external connection terminal and in the second protrusion is protected from diffusing by the diffusion protecting layer.

By using the metal foil as a power supply, the conductive metal layer is separated on the metal foil and grown according to the electrolytic plating method; the space, the through-hole, and the first open part are filled in turn with the conductive metal layer to be a penetrating via, and thereby, a void (cavity) is prevented from forming in the penetrating via.

The first resist layer is hardened according to the first thermal treatment so as to give the first resist layer tolerance against the etchant.

Moreover, a first diffusion protecting layer is formed according to the electrolytic plating method, and thereby, the diffusion protecting layer having a layer superior to the layer formed according to an electroless plating method can be obtained.

Since the resin layer containing the palladium particles therein is used for the insulating layer, when the seed layer is formed on the insulating layer, it is not necessary to perform a treatment in advance on the insulating layer. Therefore, the steps of manufacturing the substrate can be simplified.

The second diffusion protecting layer is formed according to the electrolytic plating method, and thereby, the diffusion protecting layer having a layer superior to the layer formed according to the electroless plating method can be obtained.

The heat-resistant protecting member is provided so as to cover at least the wiring and the second diffusion protecting layer, and thereby, the wiring and the second diffusion protecting layer are protected from the heat generated in the second thermal treatment performed for removing the adhesive and the support board from the base member.

According to another aspect of the embodiment of the present invention, the method for manufacturing the substrate includes the steps of removing the metal foil by etching after the step of removing the support board, removing the first resist layer, and removing the protecting member after the step of removing the first resist layer.

According to the above described steps, the protecting member is removed after the step of removing the metal foil so as to protect the wiring from being etched.

According to the embodiment of the invention, the step of forming the first diffusion protecting layer is performed immediately after the step of disposing the metal foil; thus a plating solution used for forming the first diffusion protecting layer is prevented from being mixed with another plating solution used for forming the penetrating via, and thereby, the conductive metal layer having an excellent layer can be formed.

According to the embodiment of the present invention, a substrate wherein the electric connection reliability of the penetrating via connected to the wirings is improved and a method for manufacturing the same can be provided.

The invention claimed is:

1. A method of manufacturing a substrate, the substrate comprising a base member having a through-hole and a penetrating via formed in the through-hole in the base member, the penetrating via including a penetrating part provided in the through-hole and a first protrusion provided at an end of the penetrating part, the first protrusion protruding from the base member, the method comprising:
    disposing the substrate having the through-hole on a power supply layer via a first resist layer;
    removing a portion of the first resist layer exposed to the through-hole to expose the power supply layer and forming a space being wider than the through-hole in diameter;
    hardening the first resist layer according to a first thermal treatment after forming the space; and
    forming the penetrating via by filling the space and the through-hole with a conductive metal layer formed by means of power supplied by the power supply layer after the hardening.

2. The method as claimed in claim 1, wherein the power supply layer is metal foil attached on a support board; and the metal foil is exposed to the space.

3. The method as claimed in claim 2, further comprising forming;
    a second resist layer having a first open part exposing the through-hole in the base member, the first open part being wider than the through-hole in diameter; and
    forming a second protruding part provided on another end of the penetrating part, the second protruding part protruding from the base member and being wider than the penetrating part in diameter, by filling the first open part with a conductive metal layer.

4. The method as claimed in claim 2, further comprising forming a first diffusion protecting layer on the metal foil exposed to the space through an electrolytic plating method after forming the space.

5. The method as claimed in claim 3, further comprising forming a wiring connected to the second protrusion.

6. The method as claimed in claim 5, wherein the forming a wiring comprises:
    removing the second resist layer;
    forming, on the base member, an insulating layer having a second open part exposing the second protrusion; and
    forming a seed layer on the insulating layer where the wiring is formed,
    wherein the insulating layer comprises resin containing palladium particles therein.

7. The method as claimed in claim 5, wherein the wiring has an external connection terminal,
    wherein the method further comprises forming a second diffusion protecting layer on the external connection terminal through an electrolytic plating method after forming the wiring.

8. The method as claimed in claim 7, further comprising:
disposing a heat-resistant protecting member to cover at least the wiring and the second diffusion protecting layer after forming the second diffusion protecting layer; and
removing the support board from the base member through a second thermal treatment after forming the protecting member.

9. The method as claimed in claim 8, further comprising:
removing the metal foil by etching;
removing the first resist layer; and
removing the protecting member after removing the first resist layer.

10. The method as claimed in claim 4, wherein forming the first diffusion protecting layer is performed immediately after disposing the metal foil on the support board.

11. A method of manufacturing a substrate, the substrate comprising a base member having a through-hole and a penetrating via formed in the through-hole in the base member, the penetrating via including a penetrating part provided in the through-hole and a first protrusion provided at an end of the penetrating part, the first protrusion protruding from the base member, the method comprising:
disposing the substrate having the through-hole on a power supply layer via a first resist layer;
removing a portion of the first resist layer exposed to the through-hole and a portion of the first resist layer between the base member and the power supply layer to form a space being wider than the through-hole in diameter between the base member and the power supply layer;
forming the penetrating via by filling the space and the through-hole with a conductive metal layer formed by means of power supplied by the power supply layer,
wherein the first protrusion is formed by filling the space with the conductive metal layer.

12. The method as claimed in claim 11, wherein the power supply layer is metal foil attached on a support board, and the metal foil is exposed to the space.

13. The method as claimed in claim 12, further comprising forming:
a second resist layer having a first open part exposing the through-hole in the base member, the first open part being wider than the through-hole in diameter; and
forming a second protruding part provided on another end of the penetrating part, the second protruding part protruding from the base member and being wider than the penetrating part in diameter, by filling the first open part with a conductive metal layer.

14. The method as claimed in claim 12, further comprising forming a first diffusion protecting layer on the metal foil exposed to the space through an electrolytic plating method after forming the space.

15. The method as claimed in claim 13, further comprising forming a wiring connected to the second protrusion.

16. The method as claimed in claim 15, wherein the forming a wiring comprises:
removing the second resist layer;
forming, on the base member, an insulating layer having a second open part exposing the second protrusion; and
forming a seed layer on the insulating layer where the wiring is formed,
wherein the insulating layer comprises resin containing palladium particles therein.

17. The method as claimed in claim 15, wherein the wiring has an external connection terminal,
wherein the method further comprises forming a second diffusion protecting layer on the external connection terminal through an electrolytic plating method after forming the wiring.

18. The method as claimed in claim 17, further comprising:
disposing a heat-resistant protecting member to cover at least the wiring and the second diffusion protecting layer after forming the second diffusion protecting layer; and
removing the support board from the base member through a second thermal treatment after forming the protecting member.

19. The method as claimed in claim 18, further comprising:
removing the metal foil by etching;
removing the first resist layer; and
removing the protecting member after removing the first resist layer.

20. The method as claimed in claim 14, wherein forming the first diffusion protecting layer is performed immediately after disposing the metal foil on the support board.

* * * * *